(12) United States Patent
Ko et al.

(10) Patent No.: US 10,714,418 B2
(45) Date of Patent: Jul. 14, 2020

(54) ELECTRONIC DEVICE HAVING INVERTED LEAD PINS

(71) Applicant: TEXAS INSTRUMENTS INCORPORATED, Dallas, TX (US)

(72) Inventors: Chang-Yen Ko, Taipei (TW); J K Ho, New Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 15 days.

(21) Appl. No.: 16/137,055

(22) Filed: Sep. 20, 2018

(65) Prior Publication Data

US 2019/0295939 A1    Sep. 26, 2019

Related U.S. Application Data

(60) Provisional application No. 62/648,182, filed on Mar. 26, 2018.

(51) Int. Cl.

| H01L 23/48 | (2006.01) |
|---|---|
| H01L 23/52 | (2006.01) |
| H01L 21/44 | (2006.01) |
| H01L 21/48 | (2006.01) |
| H01L 21/50 | (2006.01) |
| H01L 23/50 | (2006.01) |
| H01L 23/28 | (2006.01) |
| H01L 23/495 | (2006.01) |
| H01L 23/00 | (2006.01) |

(52) U.S. Cl.
CPC .............. *H01L 23/50* (2013.01); *H01L 23/28* (2013.01); *H01L 23/49513* (2013.01); *H01L 23/49575* (2013.01); *H01L 24/32* (2013.01); *H01L 24/49* (2013.01); *H01L 2924/14* (2013.01)

(58) Field of Classification Search
CPC ... H01L 23/50; H01L 23/28; H01L 23/49513; H01L 23/49575; H01L 24/32
USPC ........................................... 257/690; 438/123
See application file for complete search history.

(56) References Cited

U.S. PATENT DOCUMENTS

| 8,022,522 | B1 * | 9/2011 | Liou | .................... H01L 23/3107 |
| | | | | 257/676 |
| 9,620,440 | B1 | 4/2017 | Shibuya | |
| 9,881,856 | B1 | 1/2018 | Suh | |
| 2010/0006991 | A1 * | 1/2010 | Li | ....................... H01L 23/3135 |
| | | | | 257/666 |
| 2016/0197066 | A1 | 7/2016 | Uchida | |
| 2019/0006270 | A1 * | 1/2019 | Niu | .................... H01L 23/49562 |

OTHER PUBLICATIONS

PCT International Search Report dated Jul. 4, 2019.

* cited by examiner

*Primary Examiner* — David S Blum
(74) *Attorney, Agent, or Firm* — Ronald O. Neerings; Charles A. Brill; Frank D. Cimino

(57) ABSTRACT

An electronic device (e.g., integrated circuit) and method of making the electronic device is provided that reduces a strength of an electric field generated outside a package of the electronic device proximate to the low voltage lead pins. The electronic device includes a low voltage side and a high voltage side. The low voltage side includes a low voltage die attached to a low voltage die attach pad. Similarly, the high voltage side includes a high voltage die attached to a high voltage die attach pad. Lead pins are attached to each of the low and high voltage attach pads and extend out from a package of the electronic device in an inverted direction.

20 Claims, 5 Drawing Sheets

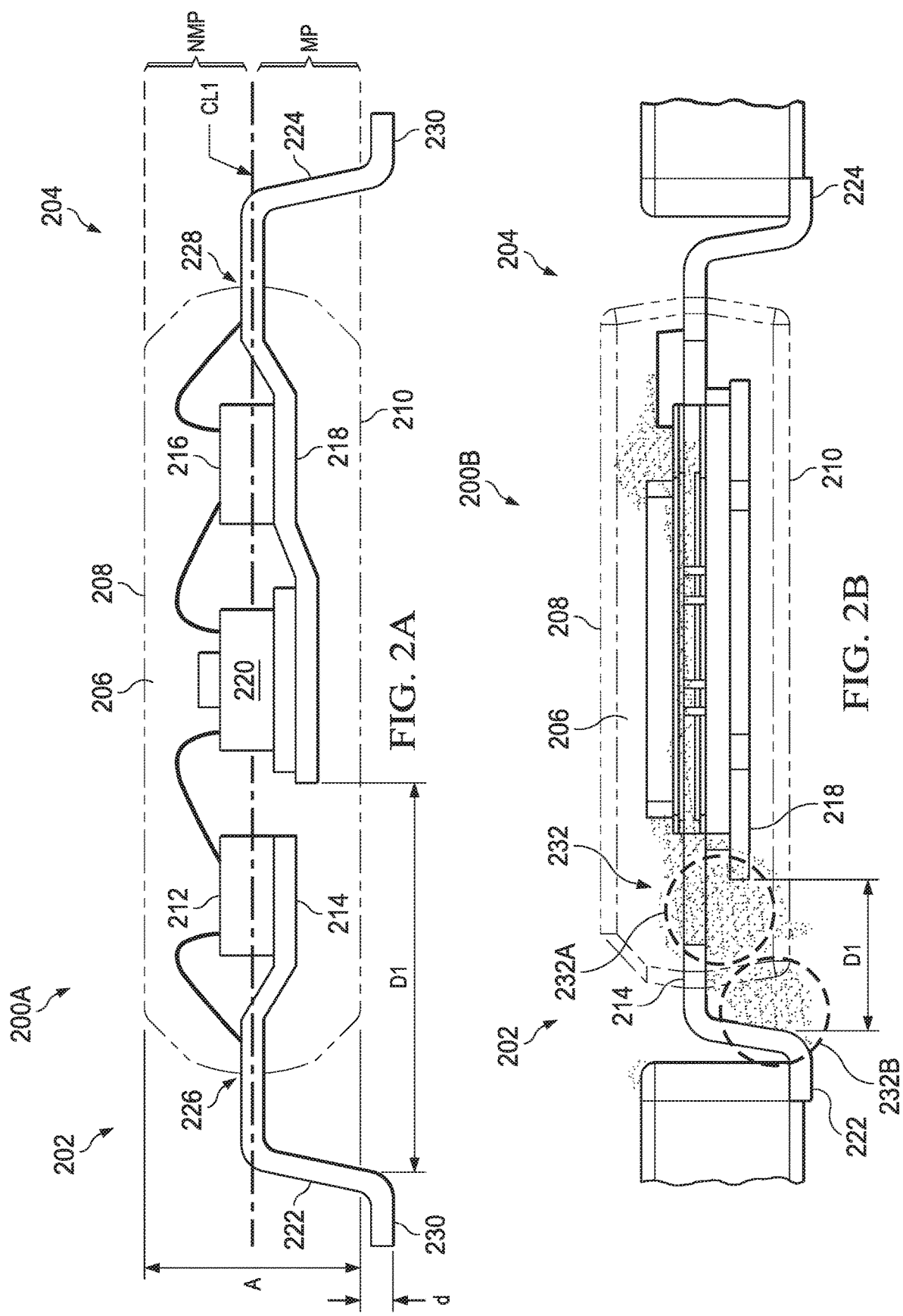

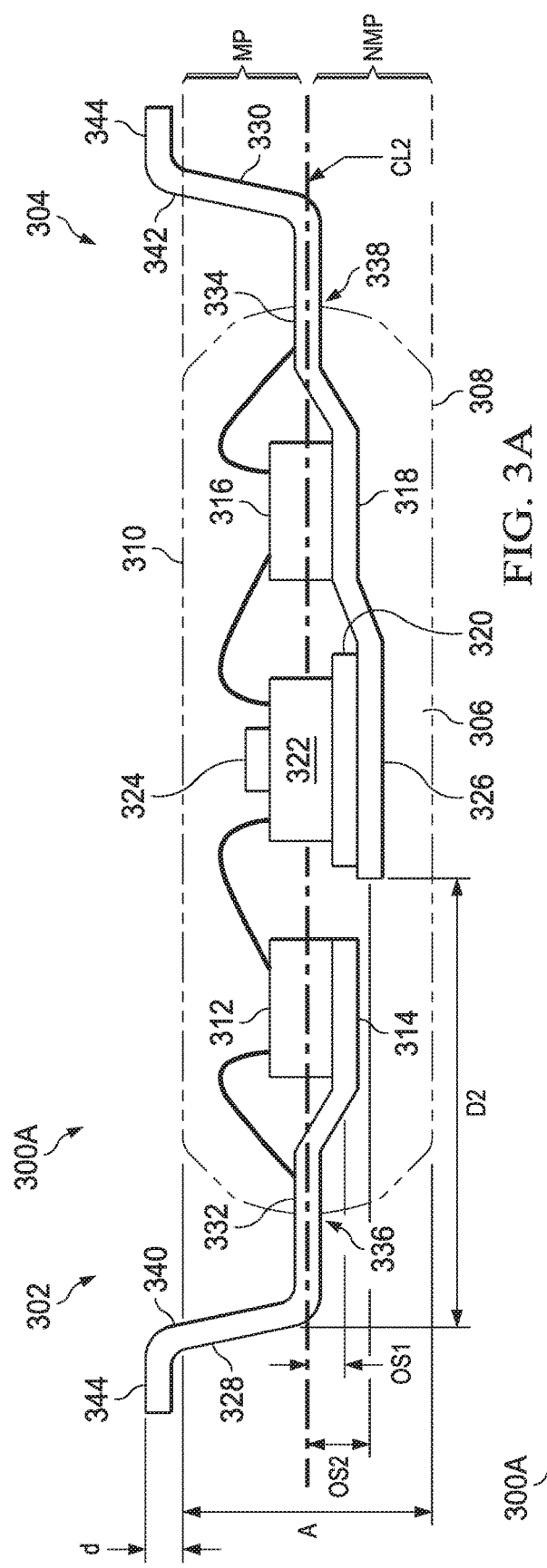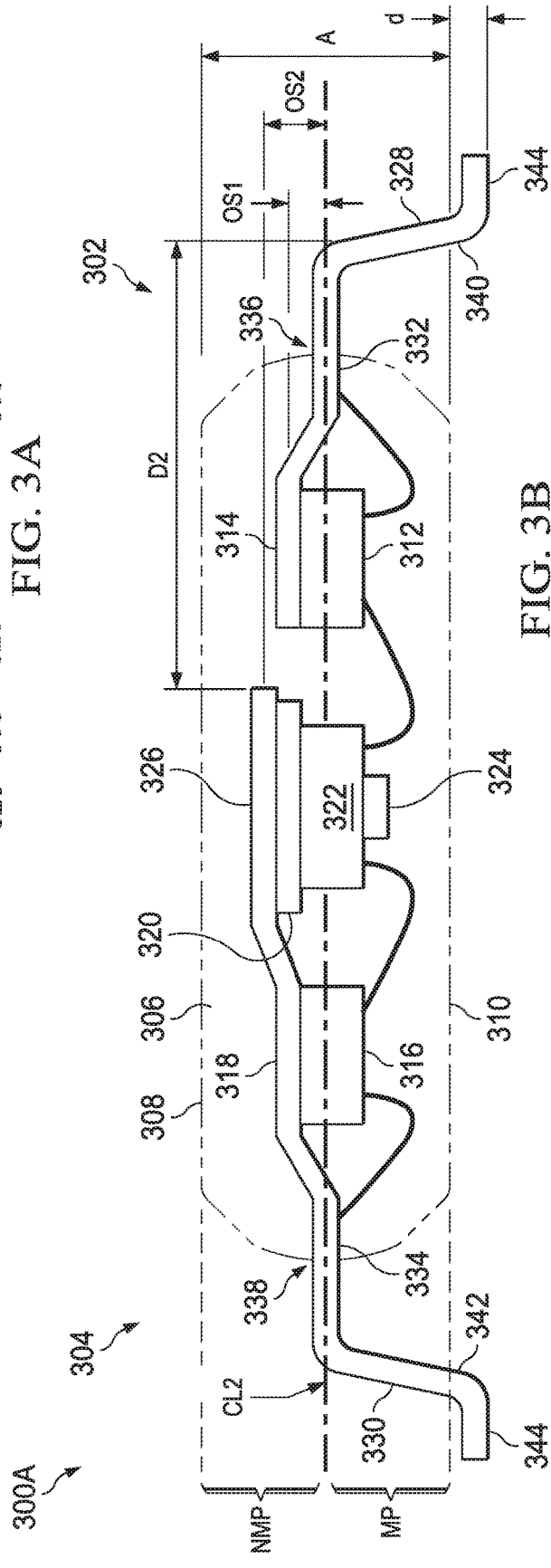
FIG. 3A
FIG. 3B

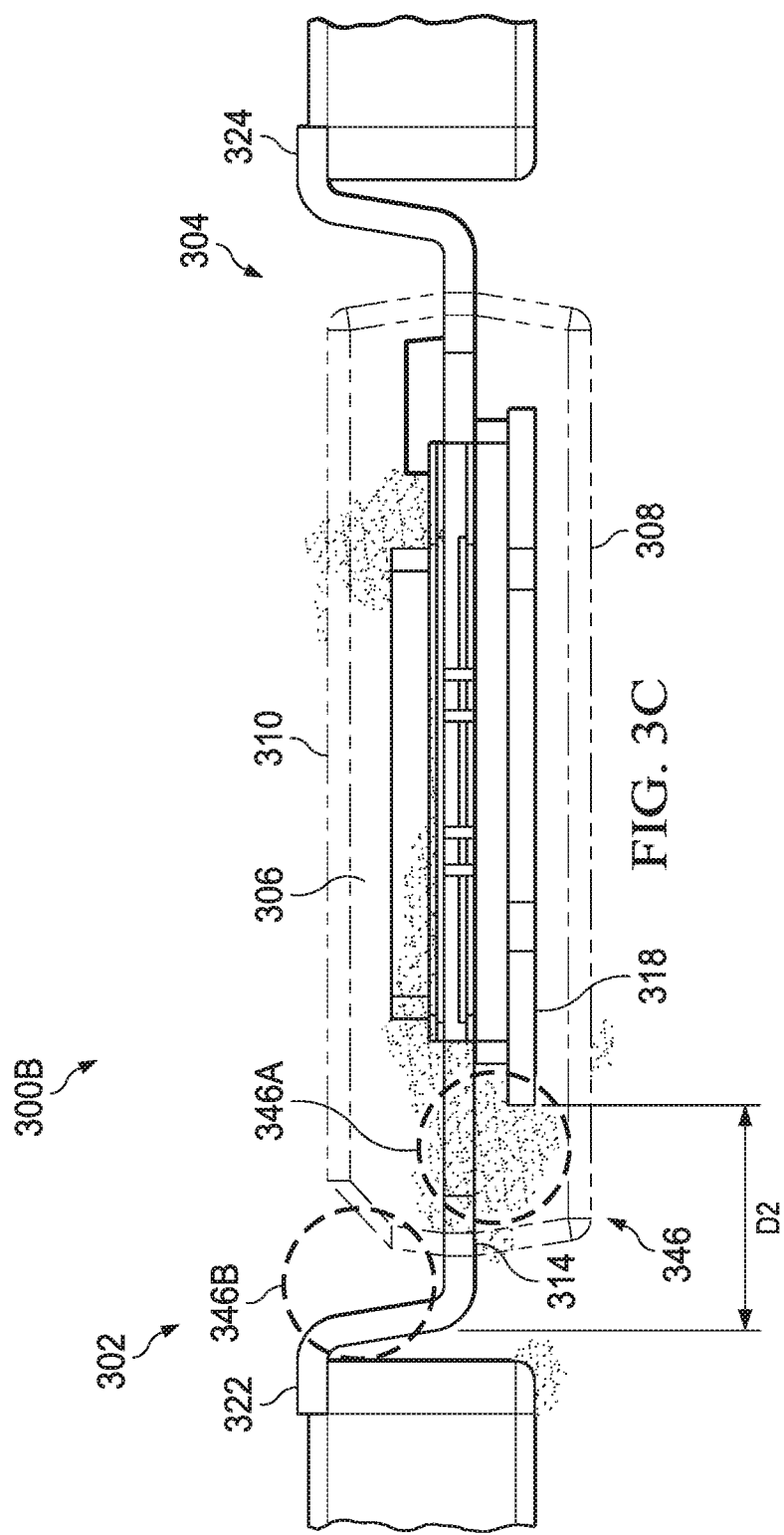

ELECTRONIC DEVICE HAVING INVERTED LEAD PINS

CROSS-REFERENCE TO RELATED APPLICATIONS

This application claims the benefit of and priority to U.S. Provisional Patent Application Ser. No. 62/648,182, filed on 26 Mar. 2018, which is hereby fully incorporated herein by reference.

TECHNICAL FIELD

This relates to an electronic device having inverted lead pins.

BACKGROUND

Integrated circuits (IC) require electrically conducting connections to provide an electrically conductive connection between the IC's contact pads to the IC package leads or lead pins. In some applications, IC's include a low voltage side having a low voltage die and a high voltage side having a high voltage die. When the IC is energized, an electric field is generated inside a package (internal e-field) of the IC between die attach pads of both the low voltage side and the high voltage side. The internal e-field is isolated by the package and has a negligible effect on the IC. The electric field, however, extends outside the package (external e-field) on the low voltage side of the IC toward low voltage lead pins.

The external e-field creates arcing between the lead pins on the low voltage side of the IC. Arcing may also occur between the low voltage lead pins and electrical terminations on a printed circuit board upon which the IC is mounted. Arcing ultimately leads to damaged electronic components including the IC.

SUMMARY

In an example, an electronic device is disclosed that includes a package. The package has a longitudinal center line, a mounting portion on one side of the longitudinal center line and a non-mounting portion on an opposite side of the longitudinal center line. A low voltage die attach pad is embedded in a non-mounting portion of the package and includes a first side facing toward the longitudinal center line and a second side facing away from the longitudinal center line. A low voltage die is attached to the first side of the low voltage die attach pad. Inverted low voltage lead pins extend from the package in a direction toward the mounting portion and away from the non-mounting portion of the package. A high voltage die attach pad is embedded in the non-mounting portion of the package and include a first side facing toward the longitudinal center line and a second side facing away from the longitudinal center line. A high voltage die is attached to the first side of the high voltage die attach pad. Inverted high voltage lead pins extending from the package in the direction toward the mounting portion and away from the non-mounting portion of the package.

In another example, an integrated circuit is disclosed that includes a package. The package has a longitudinal center line extending from a low voltage side of the package to a high voltage side. The package further includes a mounting portion on one side of the longitudinal center line and a non-mounting portion on an opposite side of the longitudinal center line. A low voltage die attach pad is embedded in the package and includes a first side facing toward the longitudinal center line toward the mounting portion of the package and a second side facing away from the longitudinal center line toward the non-mounting portion of the package. Further, the low voltage die pad is displaced at a first offset from the longitudinal center line toward the non-mounting portion of the package. A low voltage die attached to the first side of the low voltage die attach pad. Low voltage lead pins extend from the package in a direction away from the longitudinal center line and opposite a direction of the first offset. A high voltage die attach pad is embedded in the package and includes a first side facing toward the longitudinal center line toward the mounting portion of the package and a second side facing away from the longitudinal center line toward the non-mounting portion of the package. The high voltage die pad is displaced at the first offset from the longitudinal center line toward the non-mounting portion of the package. A high voltage die is attached to the first side of the high voltage die attach pad. Inverted high voltage lead pins extend from the package in the direction away from the longitudinal center line and opposite the direction of the first offset.

In another example, a method includes attaching a low voltage die to a low voltage die attach pad and a high voltage die to a high voltage die attach pad. A first end of at least one low voltage lead pin is attached to the low voltage die attach pad and a first end of at least one high voltage lead pin is attached to the high voltage die attach pad. The low voltage die and the high voltage die are placed in cavities defined in a package body of an integrated circuit. The low voltage die, the high voltage die, the low voltage die attach pad, and the high voltage die attach pad are encapsulated in a package of the integrated circuit, wherein the low voltage die attach pad and the high voltage die attach pad are displaced from a longitudinal center line of a package of the integrated circuit at a first offset in a direction toward the non-mounting portion of the package. A second end of the at least one low voltage lead pin and a second end of the at least one high voltage lead pin disposed outside the package are bent in a direction away from the longitudinal center line of the package and opposite the direction of the first offset.

BRIEF DESCRIPTION OF THE DRAWINGS

FIG. 2A is an end view of an example integrated circuit.

FIG. 2B is an end view infrared image of the example integrated circuit of FIG. 2A.

FIG. 3A is an inverted end view of an example electronic device.

FIG. 3B is an un-inverted end view of the example electronic device of FIG. 3A

FIG. 3C is an end view infrared image of the example electronic device of FIG. 3A.

DETAILED DESCRIPTION

Figure 1:
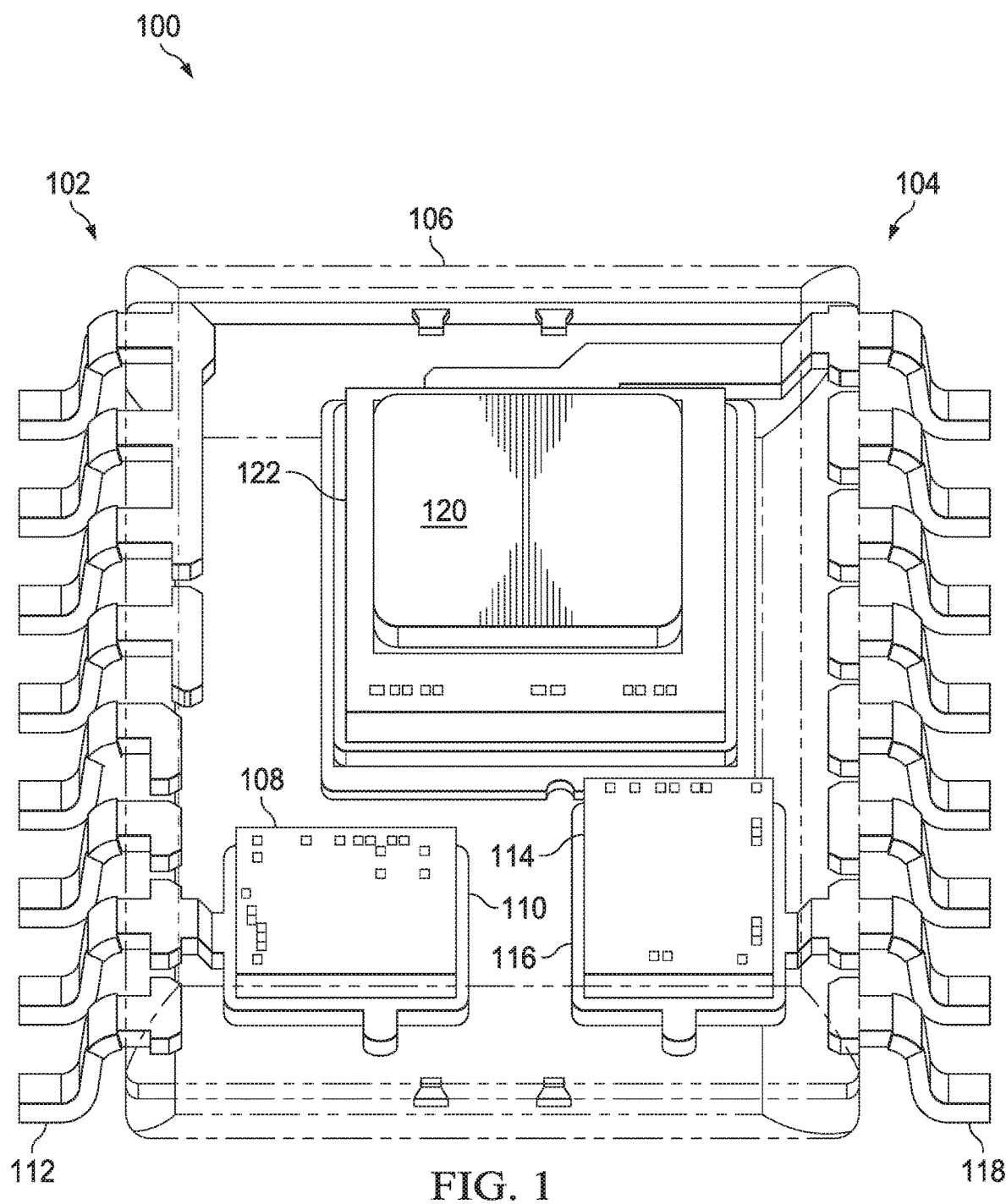
FIG. 1 is a top perspective view of an example integrated circuit.

FIG. 1 is a top perspective view of an example integrated circuit (IC) 100 that includes a low voltage side 102 and a high voltage side 104. IC's of this type experience an electric field that is generated inside and outside a package 106 of the IC 100 due to a potential difference between the low voltage side 102 and the high voltage side 104. Specifically, the low voltage side includes one or more low voltage dies 108 attached to a low voltage die pad 110 and low voltage lead pins 112 extending from the low voltage die attach pad 110. Similarly, the high voltage side 104 includes one or more high voltage dies 114 attached to a high voltage die pad 116 and high voltage lead pins 118 extending from the high voltage lead pins 118. In some example IC's, the high voltage side 104 can further include a power enhancing device 120 made from a magnetic material attached to a printed circuit board 122 (e.g., transformer). The power enhancing device 120 generates a magnetic field to enhance the power supplied to the high voltage side 104.

The electric field is generated between the low voltage die pad 110 and the high voltage die pad 116 due to the potential difference between the two and close proximity of the low and high voltage die pads 110, 116 to each other. The electric field extends outside the package 106 proximate to the low voltage lead pins 112 due to the close proximity of the high voltage die pad 116 to the low voltage lead pins 112. The electric field generated outside the package 106 proximate to low voltage lead pins causes arcing between the IC and a printed circuit board (PCB) upon which the IC is mounted or simply between adjacent low voltage lead pins 112. The arcing, in turn, causes damage to the IC and/or PCB.

Thus, disclosed herein is an electronic device (e.g., integrated circuit) and method of making the electronic device that reduces a strength of an electric field or eliminates the electric field generated outside the package of the electronic device proximate to the low voltage lead pins. The electronic device includes a low voltage side and a high voltage side. The low voltage side includes a low voltage die attached to a low voltage die attach pad. Similarly, the high voltage side includes a high voltage die attached to a high voltage die attach pad. Lead pins are attached to each of the low and high voltage attach pads and extend out from an package of the electronic device in an inverted direction. In other words, the electronic device has an inverted configuration such that a distance between the high voltage die attach pad and the low voltage lead pins is such that an electric field is not generated outside the package proximate to the low voltage lead pins. That is, the dies and the die attach pads are embedded in the package in an inverted manner as opposed to conventional practice. Further, the lead pins extend from each side of the package in a vertical direction with respect to a longitudinal axis of the electronic device opposite that of conventional practice.

FIG. 2A is an end view of an example integrated circuit (IC) 200A similar to the IC illustrated in FIG. 1 that includes a low voltage side 202 and a high voltage side 204, and a package 206 made from a molded compound (e.g., epoxy compound) that electrically isolates the low voltage side 202 from the high voltage side 204. The package 206 includes a longitudinal center line CL1 that extends from the low voltage side 202 to the high voltage side 204. The longitudinal center line CL1 is centrally positioned in the package 206 in a direction perpendicular to the longitudinal center line CL1 as indicated by the double sided arrow A between a first (non-mounting) surface 208 and a second (mounting) surface 210 of the package 206. The mounting surface 210 of the package 206 is the side of the package 206 that faces the PCB when the IC 200A is mounted to the PCB. Thus, a portion of the package 206 between the longitudinal center line CL1 and the non-mounting surface 208 is the non-mounting portion NMP of the package 206. Similarly, a portion of the package 206 between the longitudinal center line CL1 and the mounting surface 210 is the mounting portion MP of the package 206.

The low voltage side 202 includes a low voltage die 212 attached to a low voltage die attach pad (DAP) 214. Similarly, the high voltage side 204 includes a high voltage die 216 attached to a high voltage die attach pad (DAP) 218. Both the low and high voltage dies 212, 216 have electronic devices disposed therein. The low voltage die 212 and low voltage DAP 214 are electrically isolated from the high voltage die 216 and the high voltage DAP 218 by the package 206. The low voltage DAP 214 and the high voltage DAP 218 are embedded in the mounting portion MP of the package such that both the low voltage die 212 and the high voltage die 216 are centrally disposed along the longitudinal center line CL1 of the package 206. In other words, both the low voltage die 212 and the high voltage die 216 are disposed halfway between the non-mounting surface 208 and the mounting surface 210 of the package 206. The IC 200A can further include a power enhancing device 220 made from a magnetic material (e.g., transformer) attached to the high voltage DAP 218. The power enhancing device 220 generates a magnetic field to enhance the power supplied to the high voltage side 204.

The IC 200A further includes low voltage lead pins 222 on the low voltage side 202 and high voltage lead pins 224 on the high voltage side 204. At least one low voltage pin 202 is attached to and extends from the low voltage DAP 214 and at least on high voltage pin 224 is attached to and extends from the high voltage DAP 218. Both the low voltage lead pins 222 and the high voltage lead pins 224 exit the package 206 at exit openings 226, 228 respectively defined in the package 206 and extend outward from each side of the package 206 along the longitudinal center line CL1. Both the low voltage lead pins 222 and the high voltage lead pins 224 then curve in a direction toward the high voltage DAP 218 and the second surface 210 of the package 206. An attachment surface 230 of both the low voltage and the high voltage lead pins 222, 224 extends past the second surface 210 of the package 206 by a predetermined distance d (e.g., 0.314-0.414 microns).

FIG. 2B is an end view infrared image of an example IC 200B similar to the IC 200A illustrated in FIG. 2A. The infrared image in FIG. 2A illustrates the presence or absence of electric fields dispersed inside and outside the package 206. Specifically, the shaded areas enclosed in the dotted circle 232 both inside and outside the package 206 illustrate the presence of an electric field. As mentioned above, the electric field 232 is produced by the potential difference between the low voltage side 202 and the high voltage side 204 during start-up and/or operation of the IC 200A, 200B. Specifically, during start-up, the voltage on the high voltage DAP 218 can spike to approximately 7,000 volts, which in turn can cause damage to the low voltage side 202. The electric field 232A inside the package 206 is isolated by the package 206 and thus, has a negligible effect on the IC or other nearby electronic components. The electric field 232B outside the package, however, is located proximate to the low voltage lead pins 222, which causes arcing between the IC and a printed circuit board (PCB) upon which the IC is mounted thereby damaging the IC and/or PCB.

The electric field 232B is present due to the configuration of the low voltage lead pins 222 with respect to the high voltage DAP 218. More specifically, as explained above, the low voltage lead pins 222 curve in a direction toward the high voltage DAP 218. Thus, both the high voltage DAP 218 and the low voltage lead pins 222 are on the same side of the longitudinal center line CL1. Thus, a distance D1 between the high voltage DAP 218 and the low voltage lead pins 222 is close enough to generate the electric field 232B outside the package 206. The electric field 232B causes arcing between the IC and a printed circuit board (PCB) upon which the IC is mounted, which in turn causes damage to the IC and/or PCB.

FIG. 3A is an inverted end view and FIG. 3B is an un-inverted end view of an example IC 300A having a lead pin configuration that reduces the overall electric field and substantially reduces a strength or substantially eliminates the electric field outside the IC proximate to the low voltage lead pins. More specifically, the configuration of the IC 300A increases a distance D2 between the low voltage lead pins and the high voltage die attach pad such that an electric field outside the package is either substantially reduced so that it presents no adverse effects or is eliminated.

The IC 300A includes a low voltage side 302 and a high voltage side 304, and a package 306 made from a molded compound (e.g., epoxy compound) that electrically isolates the low voltage side 302 from the high voltage side 304. The package 306 includes a longitudinal center line CL2 that extends from the low voltage side 302 to the high voltage side 304. The longitudinal center line CL2 is centrally positioned in the package 306 in a direction perpendicular to the longitudinal center line CL2 as indicated by the double sided arrow A between a first (non-mounting) surface 308 and a second (mounting) surface 310 of the package 306. The mounting surface 310 of the package 306 is the side of the package 306 that faces the PCB when the IC 300A is mounted to the PCB. In addition, a portion of the package 306 between the longitudinal center line CL2 and the non-mounting surface 308 is the non-mounting portion NMP of the package 306. Similarly, a portion of the package 306 between the longitudinal center line CL2 and the mounting surface 310 is the mounting portion MP of the package 306.

The low voltage side 302 includes a low voltage die 312 attached to a low voltage die attach pad (DAP) 314. Specifically, the low voltage die 312 is attached to a side (first side) of the low voltage die attach pad 314 that faces toward the longitudinal center line CL2 and toward the mounting portion MP (away from the non-mounting portion NMP) of the package 306. An opposite side (second side) of the low voltage die attach pad 314 faces away from the longitudinal center line CL2 and away from the mounting portion MP (toward the non-mounting portion NMP) of the package 306. Similarly, the high voltage side 304 includes a high voltage die 316 attached to a high voltage die attach pad (DAP) 318. Specifically, the high voltage die 316 is attached to a side (first side) of the high voltage die attach pad 318 that faces toward the longitudinal center line CL2 and toward the mounting portion MP (away from the non-mounting portion NMP) of the package 306. An opposite side (second side) of the high voltage die attach pad 318 faces away from the longitudinal center line CL2 and away from the mounting portion MP (toward the non-mounting portion NMP) of the package 306.

Both the low voltage die 312 and the high voltage die 316 have electronic devices disposed therein. The low voltage die 312 and low voltage DAP 314 are electrically isolated from the high voltage die 316 and the high voltage DAP 318 by the package 306. The low voltage DAP 314 and the high voltage DAP 318 are embedded in the non-mounting portion NMP of the package 306 and displaced at a first offset OS1 from the longitudinal center line CL2 such that both the low voltage die 312 and the high voltage die 316 are centrally disposed along the longitudinal center line CL2 of the package 306. In other words, both the low voltage die 312 and the high voltage die 316 are disposed halfway between the non-mounting surface 308 and the mounting surface 310 of the package 306. This configuration is contrary to the configuration of the IC 200A illustrated in FIG. 2A where the low and high voltage DAP's 214, 218 are embedded in the mounting portion MP of the package 206.

In this example IC 300A, the IC 300A includes a power enhancing device comprised of a first layer of a magnetic material 320 attached to the high voltage DAP 318, a printed circuit board 322 disposed on the first layer of magnetic material 320, and a second layer of a magnetic material 324 (e.g., transformer). The power enhancing device generates a magnetic field to enhance (e.g., increase) the power supplied to the high voltage side 304. The power enhancing device may be attached to a first side of an extended portion 326 of the high voltage DAP 318 where the extended portion 326 is embedded in the non-mounting portion NMP of the package 306 and the first side faces the longitudinal center line CL2. The extended portion 326 is embedded in the non-mounting portion NMP of the package 306 such that the extended portion is displaced at a second offset OS2 from the longitudinal center line CL2 and the PCB 322 is centrally disposed along the longitudinal center line CL2 of the package 306.

The IC 300A further includes low voltage lead pins 328 on the low voltage side 302 and high voltage lead pins 330 on the high voltage side 304. A first end 332 of at least one low voltage lead pin 328 is attached to and extends from the low voltage DAP 314 and a first end 334 of at least one high voltage lead pin 330 is attached to and extends from the high voltage DAP 318. The first end 332, 334 of both the low voltage lead pins 328 and the high voltage lead pins 330 are encapsulated along the center line CL2 in the package 306. Both low voltage lead pins 328 and the high voltage lead pins 330 exit the package 306 at exit openings 336, 338 respectively defined in each side of the package 306 along the longitudinal center line CL2 of the package 306. A second end 340 of the low voltage lead pins 328 and a second end 342 of the high voltage lead pins 330 and extend outward from each side of the package 306 along the longitudinal center line CL2. The second end 340 of the low voltage lead pins 328 and the second end 342 of the high voltage lead pins 330 transition (e.g., curve, bend, etc.) in a direction away from the non-mounting portion NMP of the package 306 and hence, away from the high voltage DAP 318. An attachment surface 344 of both the low voltage lead pins 328 and the high voltage lead pins 330 extends past the second surface 310 of the package 306 by a predetermined distance d (e.g., 0.314-0.414 microns).

As illustrated in FIG. 3B, the IC 300A has an inverted configuration. Once the IC 300A is flipped for mounting, the low voltage die 312 and the high voltage die 316 are inverted with respect to the low voltage DAP 314 and the high voltage DAP 318. In other words, the low voltage die and the high voltage die 316 are mounted on opposite sides of the low voltage DAP 314 and the high voltage DAP 318 respectively as compared to the example IC 200A illustrated in FIG. 2A. Thus, the low voltage die 312 and the high voltage die 316 are mounted upside down when the IC 300A is mounted to the PCB. The upside down mounting, however, does not affect the operation or performance of the IC 300A, the low voltage die 312, the high voltage die 316, or the electronic devices inside the dies 312, 316. The inverted configuration facilitates the reduction or elimination of the electric field outside the package 306, as described herein.

FIG. 3C is an end view infrared image of an example IC 300B similar to the example IC 300A illustrated in FIG. 3A. The infrared image in FIG. 3A illustrates the presence or absence of electric fields dispersed inside the package 306. Specifically, the shaded areas enclosed in the dotted circles 346 inside the package 306 illustrate the presence of an electric field. As mentioned above, the electric field 346 is produced by the potential difference between the low voltage side 302 and the high voltage side 304. The electric field 346A inside the package 306 is isolated by the package 306 and thus, has a negligible effect on the IC or other nearby electronic components. The electric field 232B, however, that was outside the package 206 illustrated in FIGS. 2A and 2B is no longer present in the example IC 300B illustrated in FIG. 3C. In other words, the electric field no longer exists outside the package 306 proximate to the low voltage lead pins 328.

The electric field 346B outside the package is no longer present due to the configuration of the low voltage lead pins 328 with respect to the high voltage DAP 318. More specifically, as explained above, the low voltage lead pins 328 transition (e.g., curve, bend, etc.) in a direction away from the high voltage DAP 318 and toward the first surface 308 of the package 306. Thus, the high voltage DAP 318 is on an opposite side of the longitudinal center line CL2 as the low voltage lead pins 328, which is contrary to the example IC 200A, 200B illustrated in FIGS. 2A and 2B. Thus, a distance D2 between the high voltage DAP 318 and the low voltage lead pins 328 is greater than the distance D1 between the high voltage DAP 218 and the low voltage lead pins 222 described above. As a result, a strength of the electric field is reduced such that it does not have any adverse effects on the IC 300A, 300B or the electric field is eliminated.

Figure 4:
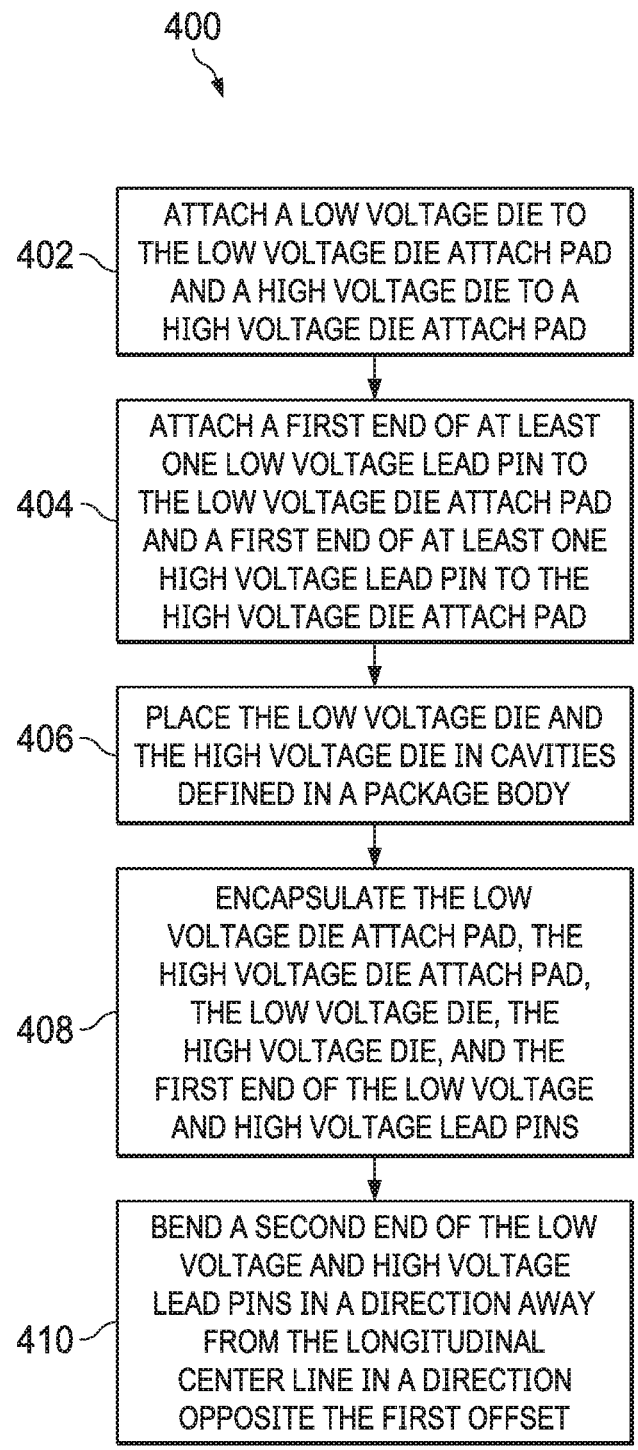
FIG. 4 is an example process of manufacturing the electronic device of FIGS. 3A and 3B.

FIG. 4 is an example process 400 of manufacturing the electronic device of FIG. 3A. At 402, a low voltage die and a high voltage die (e.g., the low voltage die 312 and the high voltage die 316) are attached to the low voltage and high voltage die attach pads respectively. At 404, a first end of at least one low voltage lead pin (e.g., the low voltage lead pin 328) and a first end of at least one high voltage lead pin (e.g., the high voltage lead pin 330) are attached to the low voltage and the high voltage DAP respectively. At 406, the low voltage die and the high voltage die are placed in cavities defined in a body of a package of the electronic device (e.g., IC 300A). At 408, the low voltage die, the high voltage die, the low voltage die attach pad, and the high voltage die attach pad are encapsulated in a package of the integrated circuit. The encapsulation includes injecting an encapsulating material into the cavities of the body where the encapsulating material surrounds the low and high voltage die attach pads, the low and high voltage dies, and the first end of the at least one low voltage lead pin and the first end of the at least one high voltage lead pin. The encapsulation further includes curing the encapsulating material. At 410, a second end of the at least one low voltage lead pin and a second end of the at least one high voltage lead pin disposed outside the package are manipulated (e.g., bent, curved, angled, etc.) bent in a direction away from the longitudinal center line of the package and opposite the direction of the first offset.

For purposes of simplification of explanation, the terms "overlay", "overlaying", "underlay" and "underlying" (and derivatives) are employed throughout this disclosure to denote a relative position of two adjacent surfaces in a selected orientation. Additionally, the terms "top" and "bottom" employed throughout this disclosure denote opposing surfaces in the selected orientation. Similarly, the terms "upper" and "lower" denote relative positions in the selected orientation. In fact, the examples used throughout this disclosure denote one selected orientation. In the described examples, however, the selected orientation is arbitrary and other orientations are possible (e.g., upside down, rotated by 90 degrees, etc.) within the scope of the present disclosure.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean at least based in part.

What is claimed is:

1. An electronic device, comprising:
   a package having a longitudinal center line, a mounting portion on one side of the longitudinal center line and a non-mounting portion on an opposite side of the longitudinal center line;
   a low voltage die attach pad embedded in a non-mounting portion of the package, the low voltage die attach pad having a first side facing toward the longitudinal center line and a second side facing away from the longitudinal center line;
   a low voltage die attached to the first side of the low voltage die attach pad;
   a plurality of low voltage lead pins extending from the package in a direction toward the mounting portion and away from the non-mounting portion of the package;
   a high voltage die attach pad embedded in the non-mounting portion of the package, the high voltage die attach pad having a first side facing toward the longitudinal center line and a second side facing away from the longitudinal center line;
   a high voltage die attached to the first side of the high voltage die attach pad; and
   a plurality of high voltage lead pins extending from the package in the direction toward the mounting portion and away from the non-mounting portion of the package.

2. The electronic device of claim 1, wherein the low voltage die and the high voltage die are centrally disposed on the longitudinal center line of the package.

3. The electronic device of claim 2, wherein the plurality of low voltage lead pins and the plurality of high voltage lead pins exit the package at exit openings defined in the package along the longitudinal center line of the package.

4. The electronic device of claim 1, wherein at least one of the plurality of low voltage lead pins is attached to the low voltage die attach pad and at least one of the plurality of high voltage lead pins is attached to the high voltage die attach pad.

5. The electronic device of claim 1, wherein an attachment surface of the plurality of low voltage lead pins and an attachment surface of the plurality high voltage lead pins extend beyond a mounting surface of the package by a predetermined distance.

6. An electronic device, comprising:
a package having a longitudinal center line, a mounting portion on one side of the longitudinal center line and a non-mounting portion on an opposite side of the longitudinal center line;
a low voltage die attach pad embedded in a non-mounting portion of the package, the low voltage die attach pad having a first side facing toward the longitudinal center line and a second side facing away from the longitudinal center line;
a low voltage die attached to the first side of the low voltage die attach pad;
a plurality of low voltage lead pins extending from the package in a direction toward the mounting portion and away from the non-mounting portion of the package;
a high voltage die attach pad embedded in the non-mounting portion of the package, the high voltage die attach pad having a first side facing toward the longitudinal center line and a second side facing away from the longitudinal center line;
a high voltage die attached to the first side of the high voltage die attach pad;
a power enhancing device attached to the high voltage die attach pad, wherein the power enhancing device increases power supplied to the high voltage die attach pad; and
a plurality of high voltage lead pins extending from the package in the direction toward the mounting portion and away from the non-mounting portion of the package.

7. The electronic device of claim 6, wherein the power enhancing device is made from a magnetic material that generates a magnetic field to increase the power supplied to the high voltage die attach pad.

8. An integrated circuit, comprising:
a package having a longitudinal center line extending from a low voltage side of the package to a high voltage side, the package including a mounting portion on one side of the longitudinal center line and a non-mounting portion on an opposite side of the longitudinal center line;
a low voltage die attach pad embedded in the package, the low voltage die attach pad having a first side facing toward the longitudinal center line toward the mounting portion of the package and a second side facing away from the longitudinal center line toward the non-mounting portion of the package, the low voltage die attach pad being displaced at a first offset from the longitudinal center line toward the non-mounting portion of the package;
a low voltage die attached to the first side of the low voltage die attach pad;
a plurality of low voltage lead pins extending from the package in a direction away from the longitudinal center line and opposite a direction of the first offset;
a high voltage die attach pad embedded in the package, the high voltage die attach pad having a first side facing toward the longitudinal center line toward the mounting portion of the package and a second side facing away from the longitudinal center line toward the non-mounting portion of the package, the high voltage die attach pad being displaced at the first offset from the longitudinal center line toward the non-mounting portion of the package;
a high voltage die attached to the first side of the high voltage die attach pad; and
a plurality of high voltage lead pins extending from the package in the direction away from the longitudinal center line and opposite the direction of the first offset.

9. The integrated circuit of claim 8, wherein the low voltage die and the high voltage die are centrally disposed on the longitudinal center line of the package.

10. The integrated circuit of claim 9, wherein the plurality of low voltage lead pins and the plurality of high voltage lead pins exit the package at exit openings defined in the package along the longitudinal center line of the package.

11. The integrated circuit of claim 8, wherein at least one of the plurality of low voltage lead pins is attached to the low voltage die attach pad and at least one of the plurality of high voltage lead pins is attached to the high voltage die attach pad.

12. The integrated circuit of claim 8, wherein an attachment surface of the plurality of low voltage lead pins and an attachment surface of the plurality high voltage lead pins extend beyond a mounting surface of the package by a predetermined distance.

13. An integrated circuit, comprising:
a package having a longitudinal center line extending from a low voltage side of the package to a high voltage side, the package including a mounting portion on one side of the longitudinal center line and a non-mounting portion on an opposite side of the longitudinal center line;
a low voltage die attach pad embedded in the package, the low voltage die attach pad having a first side facing toward the longitudinal center line toward the mounting portion of the package and a second side facing away from the longitudinal center line toward the non-mounting portion of the package, the low voltage die attach pad being displaced at a first offset from the longitudinal center line toward the non-mounting portion of the package;
a low voltage die attached to the first side of the low voltage die attach pad;
a plurality of low voltage lead pins extending from the package in a direction away from the longitudinal center line and opposite a direction of the first offset;
a high voltage die attach pad embedded in the package, the high voltage die attach pad having a first side facing toward the longitudinal center line toward the mounting portion of the package and a second side facing away from the longitudinal center line toward the non-mounting portion of the package, the high voltage die attach pad being displaced at the first offset from the longitudinal center line toward the non-mounting portion of the package;
a high voltage die attached to the first side of the high voltage die attach pad;
a power enhancing device to increase power supplied to the high voltage side, wherein the high voltage die attach pad includes an extended portion embedded in the non-mounting portion of the package displaced at a second offset from the longitudinal center line of the package toward the non-mounting portion of the package, and wherein the power enhancing device is attached to the extended portion of the high voltage die attach pad; and
a plurality of high voltage lead pins extending from the package in the direction away from the longitudinal center line and opposite the direction of the first offset.

14. The integrated circuit of claim 13, wherein the power enhancing device includes a first magnetic layer attached to a side of the extended portion of the high voltage die attach pad facing the longitudinal center line, a printed circuit board attached to the first magnetic layer, and a second magnetic layer attached to the printed circuit board.

15. The integrated circuit of claim 14, wherein the printed circuit board is centrally disposed along the longitudinal center line of the package.

16. A method comprising:
   attaching a low voltage die to a low voltage die attach pad and a high voltage die to a high voltage die attach pad;
   attaching a first end of at least one low voltage lead pin to the low voltage die attach pad and a first end of at least one high voltage lead pin to the high voltage die attach pad;
   placing the low voltage die and the high voltage die in cavities defined in a package body of an integrated circuit;
   encapsulating the low voltage die, the high voltage die, the low voltage die attach pad, and the high voltage die attach pad in a package of the integrated circuit, wherein the low voltage die attach pad and the high voltage die attach pad are displaced from a longitudinal center line of a package of the integrated circuit at a first offset in a direction toward a non-mounting portion of the package; and
   bending a second end of the at least one low voltage lead pin and a second end of the at least one high voltage lead pin disposed outside the package in a direction away from the longitudinal center line of the package and opposite the direction of the first offset.

17. The method of claim 16, wherein encapsulating comprises injecting an encapsulating material into the cavities of the body where the encapsulating material surrounds the low and high voltage die attach pads, the low and high voltage dies, and a first end of the at least one low voltage lead pin and a first end of the at least one high voltage lead pin; and curing the encapsulating material.

18. The method of claim 16, wherein the low voltage die and the high voltage die are centrally encapsulated along the longitudinal center line of the package.

19. The method of claim 16, wherein the first end of the at least one low voltage lead pin and the first end of the at least one high voltage lead pin are encapsulated along the longitudinal center line of the package.

20. A method comprising:
   attaching a low voltage die to a low voltage die attach pad and a high voltage die to a high voltage die attach pad;
   attaching a first end of at least one low voltage lead pin to the low voltage die attach pad and a first end of at least one high voltage lead pin to the high voltage die attach-pad;
   placing the low voltage die and the high voltage die in cavities defined in a package body of an integrated circuit;
   encapsulating the low voltage die, the high voltage die, the low voltage die attach pad, and the high voltage die attach pad in a package of the integrated circuit, wherein the low voltage die attach pad and the high voltage die attach pad are displaced from a longitudinal center line of a package of the integrated circuit at a first offset in a direction toward a non-mounting portion of the package; and
   bending a second end of the at least one low voltage lead pin and a second end of the at least one high voltage lead pin disposed outside the package in a direction away from the longitudinal center line of the package and opposite the direction of the first offset, wherein prior to bending a second end of the at least one low voltage lead pin and a second end of the at least one high voltage lead pin, the method further includes removing the package from a mold.

\* \* \* \* \*